(12) United States Patent
Luo et al.

(10) Patent No.: US 12,260,902 B2
(45) Date of Patent: Mar. 25, 2025

(54) COMPLEMENTARY STORAGE UNIT AND METHOD OF PREPARING THE SAME, AND COMPLEMENTARY MEMORY

(71) Applicant: Institute of Microelectronics, Chinese Academy of Sciences, Beijing (CN)

(72) Inventors: Qing Luo, Beijing (CN); Bing Chen, Beijing (CN); Hangbing Lv, Beijing (CN); Ming Liu, Beijing (CN); Cheng Lu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 170 days.

(21) Appl. No.: 18/042,574

(22) PCT Filed: Aug. 24, 2020

(86) PCT No.: PCT/CN2020/110791
§ 371 (c)(1),
(2) Date: Feb. 22, 2023

(87) PCT Pub. No.: WO2022/040859
PCT Pub. Date: Mar. 3, 2022

(65) Prior Publication Data
US 2023/0335182 A1    Oct. 19, 2023

(51) Int. Cl.
*G11C 7/22*        (2006.01)
*G11C 11/408*      (2006.01)
(Continued)

(52) U.S. Cl.
CPC ...... *G11C 11/4096* (2013.01); *G11C 11/4085* (2013.01); *G11C 11/4094* (2013.01); *H03K 19/01742* (2013.01)

(58) Field of Classification Search
CPC ............ G11C 11/4096; G11C 11/4085; G11C 11/4094; H03K 19/01742
(Continued)

(56) References Cited

U.S. PATENT DOCUMENTS 7,447,063 B2 *  11/2008  Umezawa .............. G11C 16/12
                                                    365/189.11
7,692,959 B2 *  4/2010   Krusin-Elbaum ... H10N 70/231
                                                    365/163
(Continued)

FOREIGN PATENT DOCUMENTS

CN      102945923 A       2/2013
CN      104269186 A  *    1/2015  ............. G11C 11/21
(Continued)

OTHER PUBLICATIONS

Qing Luo et al, "Complementary Memory Cell Based on Field-Programmable Ferroelectric Diode for Ultra-Low Power Current-SA Free BNN Applications", Oct. 2019, IEEE Explore, IEDM, pp. 38.5.1-38.5.4 (Year: 2019).*
(Continued)

*Primary Examiner* — Viet Q Nguyen
(74) *Attorney, Agent, or Firm* — Schwegman Lundberg & Woessner, P.A.

(57) ABSTRACT

A complementary storage unit and a method of preparing the same, and a complementary memory. The complementary storage unit includes: a control transistor, a pull-up diode and a pull-down diode. The control transistor is configured to control reading and writing of the storage unit. One end of the pull-up diode is connected to a positive selection line, and the other end thereof is connected to a source end of the control transistor, so as to control a high-level input. One end of the pull-down diode is connected to a negative selection line, and the other end thereof is connected to the source end of the control transistor, so as to control a
(Continued)

low-level input. The pull-up diode and the pull-down diode are symmetrically arranged in a first direction.

12 Claims, 5 Drawing Sheets

(51) Int. Cl.
    *G11C 11/4094* (2006.01)
    *G11C 11/4096* (2006.01)
    *H03K 19/017* (2006.01)

(58) Field of Classification Search
    USPC .................................................. 365/189.011
    See application file for complete search history.

(56) References Cited

U.S. PATENT DOCUMENTS

| | | | | |
|---|---|---|---|---|
| 7,816,767 | B2* | 10/2010 | Pei | H01L 29/7391 |
| | | | | 257/107 |
| 7,869,257 | B2* | 1/2011 | Philipp | G11C 13/0004 |
| | | | | 365/158 |
| 8,390,066 | B2* | 3/2013 | Nishizawa | H01L 29/0673 |
| | | | | 257/E27.098 |
| 8,531,871 | B2 | 9/2013 | Chang et al. | |
| 9,224,467 | B2* | 12/2015 | Hao | G11C 13/003 |
| 9,431,083 | B2* | 8/2016 | Pyo | G11C 11/1673 |
| 10,878,872 | B2* | 12/2020 | Osborne | G11C 13/003 |
| 11,205,467 | B2* | 12/2021 | Slesazeck | G11C 11/2273 |
| 11,729,997 | B2* | 8/2023 | Lin | H10B 43/20 |
| 2002/0041511 | A1 | 4/2002 | Lin | |
| 2005/0174839 | A1 | 8/2005 | Kang | |
| 2006/0239062 | A1* | 10/2006 | Liu | G11C 13/0016 |
| | | | | 365/154 |
| 2007/0121371 | A1* | 5/2007 | King | G11C 13/0011 |
| | | | | 365/154 |
| 2009/0146212 | A1* | 6/2009 | Pei | H01L 29/7391 |
| | | | | 257/350 |
| 2010/0165721 | A1 | 7/2010 | Shin | |
| 2013/0050887 | A1 | 2/2013 | Fan et al. | |
| 2016/0329094 | A1 | 11/2016 | Luan et al. | |

FOREIGN PATENT DOCUMENTS

| | | | | |
|---|---|---|---|---|
| CN | 108666419 | A | | 10/2018 |
| CN | 109461732 | A * | 3/2019 | ........... G11C 11/412 |
| CN | 111091856 | A | | 5/2020 |
| CN | 111145810 | A | | 5/2020 |
| TW | 202044249 | A * | 12/2020 | ......... G06F 12/1408 |
| WO | WO-2009040694 | A1 * | 4/2009 | ....... G06K 19/07309 |

OTHER PUBLICATIONS

"Chinese Application Serial No. 202010860293.6, Office Action dated Jul. 1, 2022", w/ English Translation, (Jul. 1, 2022), 11 pgs.
"International Application Serial No. PCT/CN2020/110791, International Search Report dated May 20, 2021", (May 20, 2021), 2 pgs.
"International Application Serial No. PCT/CN2020/110791, Written Opinion dated May 20, 2021", (May 20, 2021), 4 pgs.
Luo, Qing, et al., "Complementary memory cell based on field-programmable ferroelectric diode for ultra-low power current-SA free BNN applications", 2019 IEEE International Electron Devices Meeting (IEDM), (2019), 5 pgs.

* cited by examiner

Storage state "1"

Storage state "0"

(a)

(b)

(a)

(b)

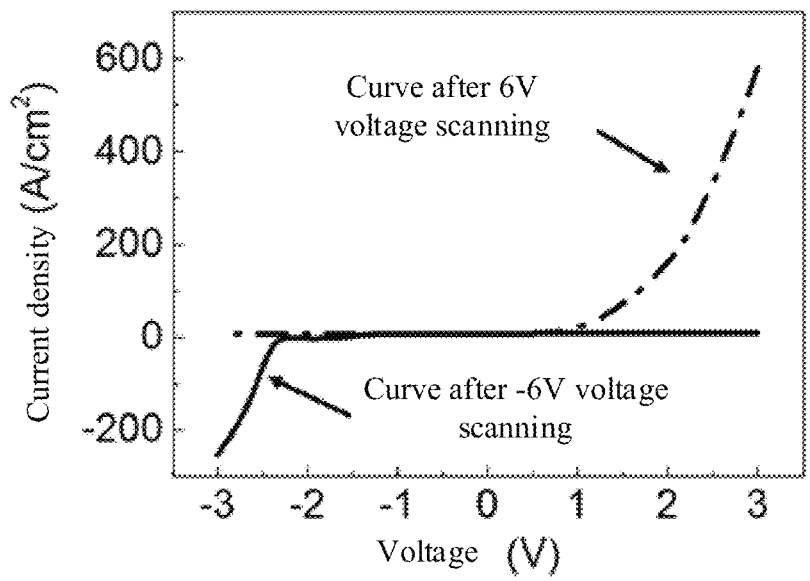

FIG. 3D

```
┌─────────────────────────────────────────────┐
│ A control transistor is formed, and the control │ ─ S410
│ transistor is used to control reading and writing of │
│           the storage unit                  │
└─────────────────────────────────────────────┘
                      │
                      ▼
┌─────────────────────────────────────────────┐
│ A pull-up diode and a pull-down diode are   │ ─ S420
│ symmetrically formed on the control transistor in │
│            a first direction                │
└─────────────────────────────────────────────┘
```

FIG. 4

COMPLEMENTARY STORAGE UNIT AND METHOD OF PREPARING THE SAME, AND COMPLEMENTARY MEMORY

PRIORITY APPLICATIONS

This application is a U.S. National Stage Filing under 35 U.S.C. § 371 from International Application No. PCT/CN2020/110791, filed on Aug. 24, 2020, and published as WO2022/040859 on Mar. 3, 2022; the benefit of priority of which is hereby claimed herein, and which application and publication is hereby incorporated herein by reference in its entirety.

TECHNICAL FIELD

The present disclosure relates to a field of microelectronics technology, and in particular to a complementary storage unit and a method of preparing the same, and a complementary memory.

BACKGROUND

In the current mainstream computer architecture, multi-level storage architecture is widely used due to the characteristics and the technical development of storage media. On-chip cache and DRAM memory are fast in reading and writing, but the storage capacity thereof is small, and data may not be maintained after power failure. External memory based on hard disk/solid state disk is slow in reading and writing, but the storage capacity thereof is large, and data may be maintained after power failure. The above-mentioned multi-level storage architectures cause the current computer system to frequently transfer data between different storage levels, reducing the computing efficiency. The development of high-speed, high-density non-volatile memory may effectively solve the above-mentioned problems.

In order to improve a storage density, a series of new memories have been proposed and widely designed, including the resistive random access memory (RRAM), the phase change memory (PCM) and the spin transfer torque-magnetic random access memory (STT-MRAM). However, these new memory devices have a double-ended structure and a resistive switch whose input may not be separated from its output. Therefore, a current sensitive amplifier (CSA) is necessarily used for reading the new memory devices. The current sensitive amplifier occupies a large chip area, so that an overall storage density is reduced.

SUMMARY

An aspect of the present disclosure provides a complementary storage unit, including: a control transistor configured to control reading and writing of the storage unit; a pull-up diode, wherein one end of the pull-up diode is connected to a positive selection line, and the other end of the pull-up diode is connected to a source end of the control transistor, so as to control a high-level input; and a pull-down diode, wherein one end of the pull-down diode is connected to a negative selection line, and the other end of the pull-down diode is connected to the source end of the control transistor, so as to control a low-level input; wherein the pull-up diode and the pull-down diode are symmetrically arranged in a first direction.

According to the embodiments of the present disclosure, a drain end of the control transistor is connected to a bit line, and a gate electrode of the control transistor is connected to a word line.

According to the embodiments of the present disclosure, when a storage state of the complementary storage unit is 1, turning-on directions of the pull-up diode and the pull-down diode point toward the source end of the control transistor; and when the storage state of the complementary storage unit is 0, the turning-on direction of the pull-up diode points toward the positive selection line, and the turning-on direction of the pull-down diode points toward the negative selection line.

According to the embodiments of the present disclosure, when a writing state of the complementary storage unit is 1, the word line is applied with a turning-on voltage VDD, the bit line is applied with a writing voltage Vwrite, and the positive selection line and the negative selection line are grounded; and when the writing state of the complementary storage unit is 0, the word line is applied with the turning-on voltage VDD, the bit line is grounded, and the positive selection line and the negative selection line are applied with the writing voltage Vwrite.

According to the embodiments of the present disclosure, when the complementary storage unit is in a reading state, the word line is applied with a turning-on voltage VDD, the positive selection line is applied with an input voltage Vin, and the negative selection line is grounded, when a storage state of the complementary storage unit is 1, an output voltage output by the bit line is high level; and when the storage state of the complementary storage unit is 0, the output voltage output by the bit line is low level.

According to the embodiments of the present disclosure, when the complementary storage unit is not selected, the word line is grounded; or the bit line is applied with a protection voltage VB, wherein VB=($\frac{1}{2}$) Vwrite.

According to the embodiments of the present disclosure, the control transistor is a MOS transistor; and the pull-up diode and the pull-down diode are the same programmable diode.

According to the embodiments of the present disclosure, the programmable diode includes: a lower electrode layer configured to support the programmable diode and provide a lower electrode of the programmable diode; a dielectric layer formed on the lower electrode layer and configured as a functional layer of the programmable diode to maintain a stable state after canceling an electrical signal; and an upper electrode layer formed on the dielectric layer and configured to provide an upper electrode of the programmable diode.

According to the embodiments of the present disclosure, the lower electrode layer is made of at least one of W, Al, Ti, Ta, Ni, Hf, TiN, and TaN; wherein the dielectric layer is made of a dielectric material with charged defects, or at least one material having ferroelectric characteristics which is selected from a perovskite type ferroelectric material, a ferroelectric polymer PVDF material and a $HfO_2$ based ferroelectric material; and wherein the upper electrode layer is made of at least one of W, Al, Cu, Ru, Ti, Ta, TiN, TaN, $IrO_2$, ITO, and IZO.

According to the embodiments of the present disclosure, the HfO2 based ferroelectric material is a HfO2 based material doped with at least one element of Zr, Al, Si, and La.

Another aspect of the present disclosure provides a complementary memory, having an array structure formed of a plurality of complementary storage units described above.

Another aspect of the present disclosure provides a method of preparing the complementary storage unit described above, including: forming a control transistor, wherein the control transistor is configured to control reading and writing of the storage unit; and symmetrically forming a pull-up diode and a pull-down diode on the control transistor in a first direction.

BRIEF DESCRIPTION OF THE DRAWINGS

FIG. 3D is a current-voltage characteristic curve diagram of a programmable diode according to the embodiments of the present disclosure.

FIG. 4 is a flow diagram of a method of preparing a complementary storage unit according to the embodiments of the present disclosure.

DETAILED DESCRIPTION OF EMBODIMENTS

Figure 1:
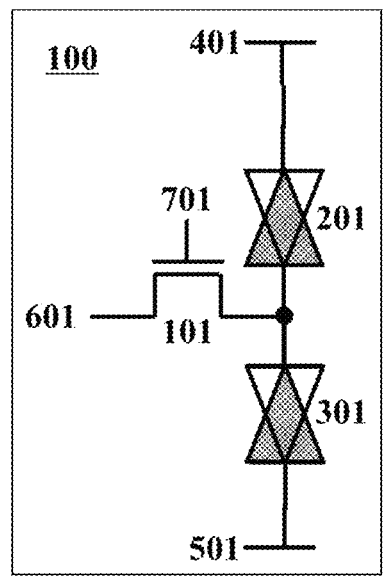
FIG. 1 is a schematic diagram of a structural composition of a complementary storage unit according to the embodiments of the present disclosure.

In order to make objectives, technical solutions and advantages of the present disclosure more apparent, the present disclosure is further described in detail below in combination with specific embodiments and with reference to the accompanying drawings.

It should be noted that implementation manners not shown or described in the accompanying drawings or the context of the specification are all in forms known to those of ordinary skill in the art, and thus are not described in detail. In addition, the above-mentioned definitions of various elements and methods are not limited to various specific structures, shapes or manners mentioned in the embodiments, and they may be simply changed or replaced by those of ordinary skill in the art.

It should also be noted that directional terms mentioned in the embodiments, such as "up", "down", "front", "back", "left", "right", etc., are only directions referring to the accompanying drawings, and are not intended to limit the scope of protection of the present disclosure. Throughout the accompanying drawings, the same elements are indicated by the same or similar reference numerals. Conventional structures or constructions will be omitted when they may obscure an understanding of the present disclosure.

In addition, shapes and sizes of various components in the drawings do not reflect actual sizes and proportions, but merely illustrate contents of the embodiments of the present disclosure. Moreover, in the claims, any reference numerals placed between parentheses should not be construed as limiting the claims.

Furthermore, the word "including" does not exclude a presence of elements or steps not listed in the claims. The word "a" or "an" preceding an element does not exclude a presence of a plurality of such elements.

Ordinal numbers used in the specification and the claims, such as "first", "second", "third", etc., which are used to indicate a corresponding element, do not mean that the element has any ordinal number, nor does it represent an ordering of one element relative to another element or an ordering of manufacturing methods. The use of such ordinal numbers is only used to clearly distinguish an element having a certain name with another element having the same name.

Those skilled in the art will appreciate that modules in an apparatus in an embodiment may be adaptively changed and arranged in one or more apparatuses different from the embodiment. Modules or units or assemblies in the embodiments may be combined into one module or unit or assembly, and they may also be divided into a plurality of sub-modules or sub-units or sub-assemblies. Except that at least some of such features and/or processes or units are mutually exclusive, any combination may be used to combine all features disclosed in the specification (including accompanying claims, abstract and drawings) and all processes or units of any method or apparatus so disclosed. Unless otherwise expressly stated, each feature disclosed in the specification (including the accompanying claims, abstract and drawings) may be replaced by substitute features with f same, equivalent or similar purpose. Moreover, in a unit claim that enumerates several devices, several of these devices may be implemented by a same hardware item.

Similarly, it should be understood that, in order to simplify the present disclosure and facilitate understanding one or more of the various disclosed aspects, in the above descriptions of exemplary embodiments of the present disclosure, various features of the present disclosure are sometimes grouped together into a single embodiment, drawing, or a description thereof. However, the disclosed method should not be construed to reflect the following intent that, the present disclosure to be protected is directed to more features than are expressly recited in each claim. More specifically, as the following claims reflect, disclosed aspects are less than all features of the single embodiment previously disclosed. Therefore, the claims following a specific embodiment are hereby explicitly incorporated into the specific embodiment, wherein each claim itself serves as a separate embodiment of the present disclosure.

In order to solve the technical problem in the related art that in a new memory device, a CSA is required for performing reading operation, thus occupying a chip area and causing a reduction of a storage density, the present disclosure provides a complementary storage unit and a method of preparing the same, and a complementary memory.

As shown in FIG. 1, an aspect of the present disclosure provides a complementary storage unit 100, including: a control transistor 101, a pull-up diode 201 and a pull-down diode 301. The control transistor 101 is used to control reading and writing of the complementary storage unit. One end of the pull-up diode 201 is connected to a positive selection line 401, the other end of the pull-up diode is connected to a source end of the control transistor 101, so as to control a high-level input. One end of the pull-down diode 301 is connected to a negative selection line 501, the other end of the pull-down diode is connected to the source end of the control transistor 101, so as to control a low-level input.

The pull-up diode 201 and the pull-down diode 301 are symmetrically arranged in a first direction.

According to the embodiments of the present disclosure, a drain end of the control transistor 101 is connected to a bit line 601, and a gate electrode is connected to a word line 701.

Therefore, the complementary storage unit 100 of the present disclosure is formed by the control transistor 101 and the two diodes symmetrically arranged, so that the complementary storage unit may be used as an input unit of weight 1 or 0, that is, a weight unit. Based on a design of the above-mentioned complementary storage unit, a current output signal may be converted into a voltage output to increase a noise tolerance, which may solve problems of power consumption and operation delay caused by complex circuits such as a sensitive amplifier, etc., in a resistive memory.

TABLE 1

|  |  | Writing | | Reading | |
| --- | --- | --- | --- | --- | --- |
|  |  | State "1" | State "0" | State "1" | State "0" |
| Selected units | 701 | $V_{dd}$ | $V_{dd}$ | $V_{dd}$ | $V_{dd}$ |
|  | 601 | GND | $V_{write}$ | $V_{in}$ | GND |
|  | 401 | $V_{write}$ | GND | $V_{in}$ |  |
|  | 501 | $V_{write}$ | GND | GND |  |
| Unselected units | 701 | GND | GND | GND |  |
|  | 601 | $½V_{write}$ | $½V_{write}$ | n/a |  |
|  | 401 | n/a | n/a | $V_{in}$ |  |
|  | 501 | n/a | n/a | GND |  |

Figure 2A:
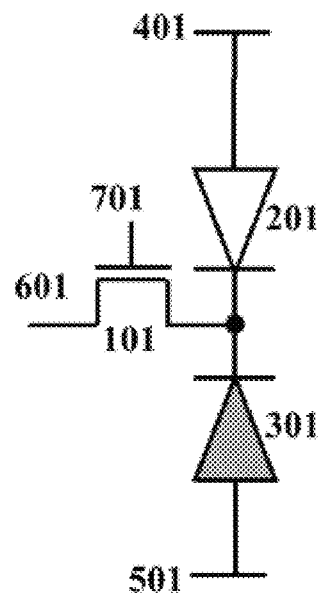
FIG. 2A is a schematic diagram of a turning-on direction of storage weight state 1 in a complementary storage unit according to the embodiments of the present disclosure.

As shown in FIG. 2A and Table 1, according to the embodiments of the present disclosure, when a storage state of the complementary storage unit 100 is 1, turning-on directions of the pull-up diode 201 and the pull-down diode 301 point toward the source end of the control transistor 101.

The turning-on directions may be understood as a current flow direction of the pull-up diode 201 and a current flow direction of the pull-down diode 301, that is, the turning-on directions point toward the source end of the control transistor 101 means that a current of the pull-up diode 201 flows toward the source end of the control transistor 101, and a current of the pull-down diode 301 also flows toward the source end of the control transistor 101.

Figure 2B:
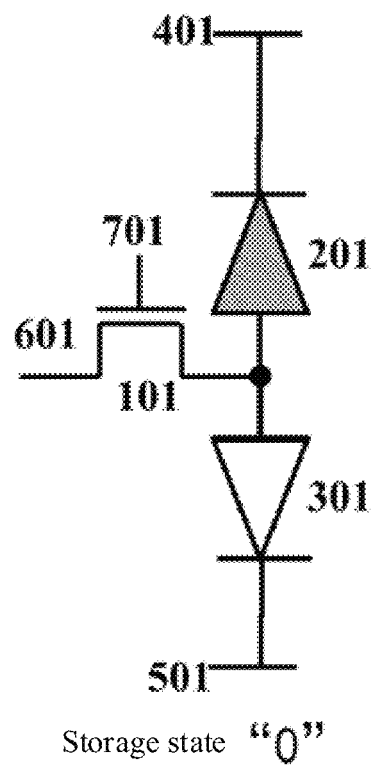
FIG. 2B is a schematic diagram of a turning-on direction of storage weight state 0 in a complementary storage unit according to the embodiments of the present disclosure.

As shown in FIG. 2B and Table 1, according to the embodiments of the present disclosure, when the storage state of the complementary storage unit 100 is 0, the turning-on direction of the pull-up diode 201 points toward a positive selection line 401, and the turning-on direction of the pull-down diode 301 points toward a negative selection line 501.

The turning-on directions may be understood as the current flow direction of the pull-up diode 201 and the current flow direction of the pull-down diode 301, that is, the turning-on direction points toward the positive selection line 401 means that the current of the pull-up diode 201 flows toward the positive selection line 401; and the turning-on direction points toward the negative selection line 501, and the current of the pull-down diode 301 flows toward the negative selection line 501 correspondingly.

As shown in FIGS. 1 to 2B and Table 1, according to the embodiments of the present disclosure, when a writing state of the complementary storage unit 100 is 1, the word line 701 is applied with a turning-on voltage $V_{DD}$, the bit line 601 is applied with a writing voltage $V_{write}$, and the positive selection line 401 and the negative selection line 501 are grounded. Correspondingly, when the writing state of the complementary storage unit 100 is 0, the word line 701 is applied with the turning-on voltage $V_{DD}$, the bit line 601 is grounded, and the positive selection line 401 and the negative selection line 501 are applied with the writing voltage $V_{write}$.

As shown in FIGS. 1 to 2B and Table 1, according to the embodiments of the present disclosure, when the complementary storage unit 100 is in a reading state, the word line is applied with the turning-on voltage $V_{DD}$, the positive selection line 401 is applied with an input voltage $V_{in}$, and the negative selection line 501 is grounded, wherein: when the storage state of the complementary storage unit 100 is 1, an output voltage output by the bit line 601 is high level; and when the storage state of the complementary storage unit 100 is 0, the output voltage output by the bit line 601 is low level.

In the embodiments of the present disclosure, when the storage state of the complementary storage unit 100 is 1 or 0, that is, a stored weight is 1 or 0 when the complementary storage unit is in said storage state.

As shown in FIGS. 1 to 2B and Table 1, according to the embodiments of the present disclosure, when the complementary storage unit 100 is not selected, the word line 701 is grounded. Alternatively, when the complementary storage unit 100 is not selected, the bit line 601 is applied with a protection voltage $V_B$, wherein $V_B=(½)V_{write}$.

According to the embodiments of the present disclosure, the control transistor 101 is a MOS transistor, i.e., a metal oxide semiconductor (MOS) structure transistor, such as a PMOS transistor or an NMOS transistor. The pull-up diode 201 and the pull-down diode 301 are the same programmable diode.

Figure 3A:
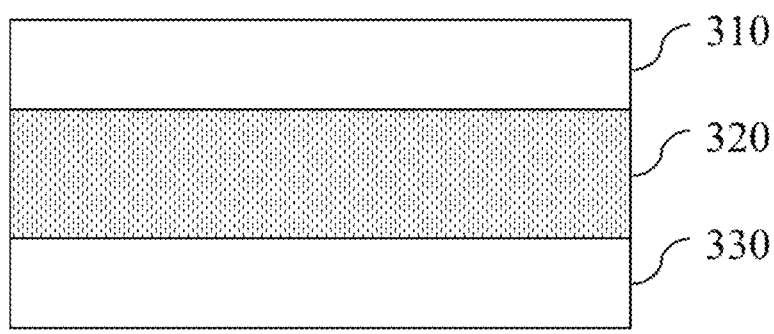
FIG. 3A is a schematic diagram of a structural composition of a programmable diode according to the embodiments of the present disclosure.

As shown in FIG. 3A, according to the embodiments of the present disclosure, a programmable diode 300 includes: a lower electrode layer 330, a dielectric layer 320 and an upper electrode layer 310. The lower electrode layer 330 is used to support the programmable diode 300 and provide a lower electrode of the programmable diode 300. The dielectric layer 320 is formed on the lower electrode layer 330 and is used as a functional layer of the programmable diode 300 so as to maintain a stable state after canceling an electrical signal. The upper electrode layer 310 is formed on the dielectric layer 320 and is used to provide an upper electrode of the programmable diode 300.

According to the embodiments of the present disclosure, when a positive reading voltage Vr is applied to the lower electrode layer 330, the programmable diode has at least the following two states.

In state 1, an absolute value of a current flowing through the diode when the positive reading voltage Vr is applied is less than an absolute value of a current flowing through the diode when a negative reading voltage −Vr having the same magnitude as that of the positive reading voltage Vr is applied.

In state 2, an absolute value of a current flowing through the diode when the positive reading voltage Vr is applied is greater than an absolute value of a current flowing through the diode when a negative reading voltage −Vr having the same magnitude as that of the positive reading voltage Vr is applied.

When a reading voltage Vr with a specific absolute value is applied to the programmable diode, a state with a maximum ratio of the absolute value of the positive current to the absolute value of the negative current is a positive highest state, and a state with a minimum ratio of the absolute value of the positive current to the absolute value of the negative current is a negative highest state. In addition, when the programmable diode needs to be applied with a reading voltage with a specific absolute value under different internal states, the ratio of the absolute value of the positive current to the absolute value of the negative current may be a plurality of values or continuously changing values between of the positive highest state and the negative highest state, so that the programmable diode may be in different states or continuously changing states, so as to realize an adjustment of a current flow direction. In addition, when the programmable diode is used for a resistive memory, a forward voltage may be used as a reading voltage. A forward conduction state may be regarded as a low resistance state, and a reverse conduction state may be regarded as a high resistance state, which are used to store 0 and 1, respectively.

According to the embodiments of the present disclosure, the programmable diode 300 may be a programmable diode with a ferroelectric material, i.e., a ferroelectric diode. The lower electrode layer 330 is made of at least one of W, Al, Ti, Ta, Ni, Hf, TiN and TaN. The dielectric layer 320 is made of a dielectric material with charged defects, or at least one material having ferroelectric characteristics which is selected from a perovskite type ferroelectric material, a ferroelectric polymer PVDF material and a $HfO_2$ based ferroelectric material. The upper electrode layer 310 is made of at least one of W, Al, Cu, Ru, Ti, Ta, TiN, TaN, $IrO_2$, ITO and IZO.

Figure 3B:
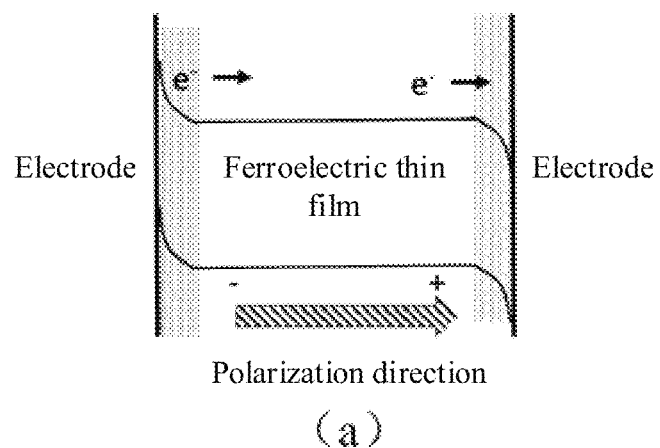
FIG. 3B is a schematic diagram of a technical principle of a programmable diode according to the embodiments of the present disclosure.
Figure 3B:
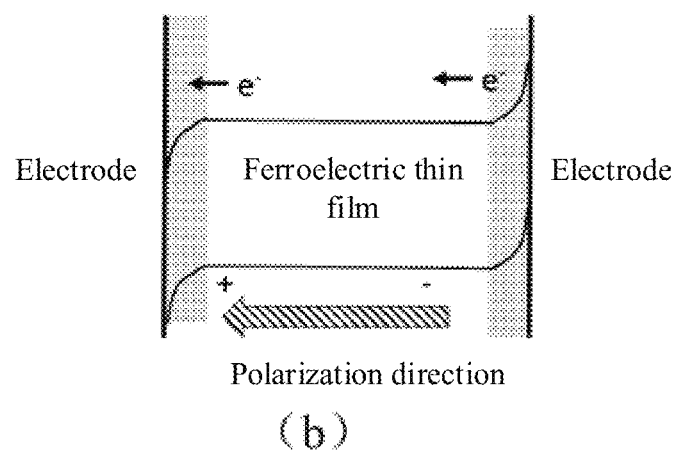

As shown in FIG. 3B, in the dielectric layer 320 made of materials having ferroelectric characteristics, a ferroelectric thin film of the dielectric layer 320 forms schottky junctions, i.e., schottky contacts, at respective contacts with the upper and lower electrodes before polarization. After polarization, a polarized electric field may lead to a directional movement of electrons. As shown in FIG. 3B (a), electrons on the left side move toward an interior of the ferroelectric thin film, resulting in an enhancement of a Schottky barrier at an interface. Electrons on the right move toward the interface, lowering the Schottky barrier. When the electrons gather to a certain amount, an ohmic contact is formed. In this way, one side is the Schottky contact, and the other side is the ohmic contact, so that a diode with unidirectional conduction is formed. As shown in FIG. 3B (b), when an electric domain is reversed, a direction of the polarized electric field changes, the direction of the electron movement is also reversed, leading to the right side being the Schottky contact, the left side being the ohmic contact, and the conduction direction of the diode is also reversed.

In the embodiments of the present disclosure, since the above-mentioned ferroelectric diode has power-off retention characteristic realized by ferroelectric reversion (that is, when the ferroelectric diode loses the electrical signal, the ferroelectric diode still has the characteristic of maintaining a stable state), an operation response speed of the above-mentioned complementary memory of the present disclosure reaches nanosecond level to realize an application of memory.

Figure 3C:
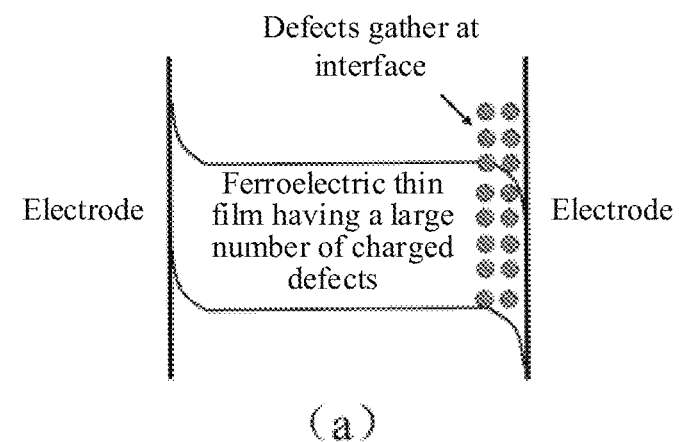
FIG. 3C is a schematic diagram of another technical principle of another programmable diode according to the embodiments of the present disclosure.
Figure 3C:
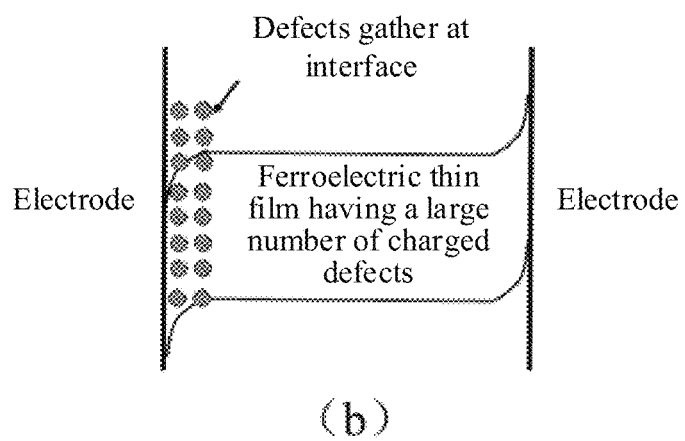

As shown in FIG. 3C, according to the embodiments of the present disclosure, the programmable diode 300 may also be a diode with a dielectric material having a large number of charged defects. As a dielectric film in the dielectric layer 320 is prepared by using the dielectric material having a large number of charged defects, there may be a large number of charged defects in the dielectric layer 320, such as positively charged oxygen vacancies. Under an action of the electric field, the defects gather to an interface region, so that an original Schottky contact is damaged. Thus, as shown in FIG. 3C (a), one side is Schottky contact, and the other side is ohmic contact, and the unidirectional conduction characteristic of the diode is formed. After the diode is applied with a reverse voltage, as shown in FIG. 3C (b), the defects gather to the other side, and the conduction direction of the diode is reversed.

Therefore, when a voltage greater than a forward threshold voltage $V_0$=6V of the diode 300 is applied between the lower electrode 330 and the upper electrode 310, the diode 300 is positively polarized, which is shown in that when the positive reading voltage Vr is applied to the lower electrode 330, the absolute value of the current flowing through the diode 300 is greater than the absolute value of the current when the negative reading voltage −Vr having the same magnitude as that of the positive reading voltage Vr is applied, and the corresponding stable characteristics are maintained after power-off. When a voltage less than a negative threshold voltage $-V_0$ is applied between the electrode 330 and the electrode 310, the diode 300 is negatively polarized, which is shown in that when the positive reading voltage Vr is applied to the lower electrode 330, the absolute value of the current flowing through the diode 300 is less than the absolute value of the current when the negative reading voltage −Vr having the same magnitude as that of the positive reading voltage Vr is applied, and the corresponding characteristics are maintained after power-off. Thus, as shown in FIG. 3D, the programmable diode 300 may maintain good power-off retention characteristics in both positive and negative polarization. Specifically, the power-off retention characteristic is that the programmable diode 300 may still maintain a stable state after the electrical signal is canceled.

According to the embodiments of the present disclosure, the $HfO_2$ based ferroelectric material is a $HfO_2$ based material doped with at least one element of Zr, Al, Si, and La so as to better realize the above-mentioned power-off retention characteristic.

Based on the above-mentioned programmable diode, the symmetric storage unit of the present disclosure has the power-off retention characteristic, and the power-off retention characteristic is determined by its own material characteristics, so that its power consumption is reduced. On the other hand, with an cooperation of a first control transistor and a second control transistor, the symmetric storage unit of the present disclosure may effectively prevent excessive current of the weight unit while storing the weight 1 or 0.

Another aspect of the present disclosure provides a complementary memory having an array structure formed of a plurality of the above-mentioned complementary storage units 100.

Therefore, through the above-mentioned complementary storage unit 100, the complementary memory of the present disclosure may reach nanosecond-level operation response speed, so that the problem of operation delay is effectively solved. Moreover, with the assistance of the complementary storage unit 100, a current signal output may be converted into a voltage signal output to increase a noise tolerance, so that the complementary memory of the present disclosure may directly omit complex reading circuits such as the sensitive amplifier, etc., the memory area is saved, the actual area of the memory is greatly reduced, and the power consumption the memory is reduced.

As shown in FIG. 1 and FIG. 4, another aspect of the present disclosure provides a method of preparing the above-mentioned complementary storage unit 100, including the following steps.

In S410, a control transistor 101 is formed, and the control transistor is used to control reading and writing of the storage unit 100.

In S420, a pull-up diode 201 and a pull-down diode 301 are symmetrically formed on the control transistor 101 in a first direction.

In S410, a preparation process of the control transistor 101 may be carried out according to the preparation process of MOS transistor provided in the related art, specifically involving the preparation processes of PMOS transistor and NMOS transistor.

In S420, for a preparation process of the pull-up diode 201 and the pull-down diode 301 on the control transistor 101, since the pull-up diode 201 and the pull-down diode 301 are symmetrically arranged in the first direction, and the two are the same programmable diode, thus a simultaneous preparation of the pull-up diode 201 and the pull-down diode 301 may be considered. Certainly, the pull-up diode 201 may be prepared first and then the pull-down diode 301 may be prepared, or the pull-down diode 301 may be prepared first and then the pull-up diode 201 may be prepared.

In the embodiments of the present disclosure, the programmable upper electrode layer 310 and lower electrode layer 330 may be prepared by one process of electron beam evaporation, chemical vapor deposition, pulsed laser deposition, atomic layer deposition, and various sputtering processes, or may be prepared by a combination of at least two processes described above. The prepared electrodes have various thicknesses and shapes, which are not limited in the present disclosure.

In the present disclosure, the doped $HfO_2$ based dielectric layer 320 is taken as an example to illustrate the preparation process of the dielectric layer 320. The dielectric layer 320 may be obtained by doping at least one of Zr, Al, Si, La, and the like with $HfO_2$ material in the preparation process. A doping method may be either an atomic layer deposition (ALD) cycle growth method or a co-sputtered method. A doping concentration of the element varies from 0.1% to 50%. Then, an annealing treatment is carried out. An annealing temperature is between 400° C. and 1000° C., and an annealing time is between 30 s and 300 s.

In order for those skilled in the art to better understand, in the embodiments of the present disclosure, as shown in FIG. 3A, taking the lower electrode layer 330 of TiN material, dielectric layer 320 of $Hf_{0.5}Zr_{0.5}O_2$ material and the upper electrode layer 310 of TiN material as an example to describe in detail the preparation process of any one of the pull-up diode 201 and the pull-down diode 301, which is as follows.

In S421, the lower electrode layer 330 is formed. The lower electrode layer 330 may be formed by a chemical plating process or a sputtering process. Preferably, the lower electrode of TiN material of the programmable diode may be formed by the sputtering process. A thickness of the lower electrode layer 330 may be between 10 nm and 500 nm. The preparation process of the lower electrode layer 330 may adopt the following process conditions: a sputtering power is 25 W to 500 W; a reaction pressure is 0.1 Pa to 100 Pa; a flow of Ar is 0.5 sccm to 100 sccm.

In S422, the dielectric layer 320 is formed. A doped $HfO_2$ based ferroelectric material film is formed on the lower electrode layer 330. Preferably, the $Hf_{0.5}Zr_{0.5}O_2$ layer may be grown as the dielectric layer 320 in a way of atomic layer deposition cycle growth of $HfO_2$ and $ZrO_2$. Specifically, the following process conditions may be adopted: a preparation power is 25 W to 500 W; a reaction pressure is 0.1 Pa to 100 Pa; a flow of Ar is 60 sccm; a reaction temperature is 250° C. to 300° C.; and a growth rate of the dielectric layer is about 0.07 nm/cycle. A cycle of $HfO_2$ is grown followed by growing a cycle of $ZrO_2$. In this way, the dielectric layer 320 is formed by mixing and depositing the two materials in a ratio of 1:1.

In S423, annealing is performed. An annealing temperature is between 400° C. and 1000° C., and an annealing time is between 30 s and 300 s. Preferably, the annealing temperature of 400° C. and the annealing time of 30 s may be adopted to form the final dielectric layer 320 of $Hf_{0.5}Zr_{0.5}O_2$ material.

In S424, the upper electrode layer 310 is formed. Similar to the preparation process of the lower electrode layer 330, as a preferred solution, TiN may be used as a preparation material, and the upper electrode layer 310 may be prepared by the sputtering process. A thickness of the upper electrode layer 310 may be between 10 nm and 500 nm. Specific conditions of the preparation process of the upper electrode layer 310 are as follows: a sputtering power is 25 W to 500 W; a reaction pressure is 0.1 Pa to 100 Pa; and a flow of Ar is 0.5 sccm to 100 sccm.

Based on the above-mentioned preparation method, the programmable diode device of the embodiments of the present disclosure as shown in FIG. 3A may be obtained. As shown in FIG. 3D, after a bias scanning voltage of 0 to 6V is applied to the programmable diode, the programmable diode exhibits forward turning-on diode characteristics; and after a bias scanning voltage of 0 to −6V is applied to the programmable diode, the programmable diode exhibits reverse turning-on diode characteristics. That is, the programmable diode shows a good current flow direction adjustment effect. In this way, the complementary storage unit of the present disclosure realizes the adjustment of the current flow direction, so that the complementary memory of the present disclosure has extremely high practicability, and scientific research and commercial values.

The present disclosure provides a complementary storage unit and a method of preparing the same, and a complementary memory. The complementary storage unit includes a control transistor, a pull-up diode and a pull-down diode. The control transistor is used to control reading and writing of the storage unit. One end of the pull-up diode is connected to a positive selection line, and the other end of the pull-up diode is connected to a source end of the control transistor, so as to control a high-level input. One end of the pull-down diode is connected to a negative selection line, and the other end of the pull-down diode is connected to the source end of the control transistor, so as to control a low level input. The pull-up diode and the pull-down diode are symmetrically arranged in a first direction. Based on the design of the above-mentioned complementary storage unit, the complementary memory of the present disclosure may realize voltage output and various operations of the memory without a need for complex circuits such as a sensitive current amplifier, etc., which greatly reduces a circuit complexity of the memory, reduces an area size of the memory, improves a memory storage density, and reduces a memory power consumption.

So far, the embodiments of the present disclosure have been described in detail in combination with the accompanying drawings.

The specific embodiments described above further explain the objectives, technical solutions and advantages of the present disclosure in detail. It should be understood that the specific embodiments described above are only specific embodiments of the present disclosure, and should not be used to limit the present disclosure. Any modifications, equivalent replacements, improvements and the like made within the spirit and principle of the present disclosure should be included in the protection scope of the present disclosure.

What is claimed is:

1. A complementary storage unit, comprising:
   a control transistor configured to control reading and writing of the storage unit;
   a pull-up diode, wherein one end of the pull-up diode is connected to a positive selection line, and the other end of the pull-up diode is connected to a source end of the control transistor, so as to control a high-level input; and
   a pull-down diode, wherein one end of the pull-down diode is connected to a negative selection line, and the other end of the pull-down diode is connected to the source end of the control transistor, so as to control a low-level input;
   wherein the pull-up diode and the pull-down diode are symmetrically arranged in a first direction.

2. The complementary storage unit according to claim 1, wherein a drain end of the control transistor is connected to a bit line, and a gate electrode of the control transistor is connected to a word line.

3. The complementary storage unit according to claim 2, wherein when a storage state of the complementary storage unit is 1, turning-on directions of the pull-up diode and the pull-down diode point toward the source end of the control transistor; and
   wherein when the storage state of the complementary storage unit is 0, the turning-on direction of the pull-up diode points toward the positive selection line, and the turning-on direction of the pull-down diode points toward the negative selection line.

4. The complementary storage unit according to claim 2, wherein when a writing state of the complementary storage unit is 1, the word line is applied with a turning-on voltage VDD, the bit line is applied with a writing voltage $V_{write}$, and the positive selection line and the negative selection line are grounded; and
   wherein when the writing state of the complementary storage unit is 0, the word line is applied with the turning-on voltage $V_{DD}$, the bit line is grounded, and the positive selection line and the negative selection line are applied with the writing voltage $V_{write}$.

5. The complementary storage unit according to claim 2, wherein when the complementary storage unit is in a reading state, the word line is applied with a turning-on voltage $V_{DD}$, the positive selection line is applied with an input voltage Vin, and the negative selection line is grounded,
   wherein when a storage state of the complementary storage unit is 1, an output voltage output by the bit line is high level; and
   wherein when the storage state of the complementary storage unit is 0, the output voltage output by the bit line is low level.

6. The complementary storage unit according to claim 2, wherein when the complementary storage unit is not selected,
   the word line is grounded; or
   the bit line is applied with a protection voltage $V_B$, wherein $V_B=(½) V_{write}$.

7. The complementary storage unit according to claim 1, wherein the control transistor is a MOS transistor; and
   wherein the pull-up diode and the pull-down diode are the same programmable diode.

8. The complementary storage unit according to claim 7, wherein the programmable diode comprises:
   a lower electrode layer configured to support the programmable diode and provide a lower electrode of the programmable diode;
   a dielectric layer formed on the lower electrode layer and configured as a functional layer of the programmable diode to maintain a stable state after canceling an electrical signal; and
   an upper electrode layer formed on the dielectric layer and configured to provide an upper electrode of the programmable diode.

9. The complementary storage unit according to claim 8, wherein the lower electrode layer is made of at least one of W, Al, Ti, Ta, Ni, Hf, TiN, and TaN;
   wherein the dielectric layer is made of a dielectric material with charged defects, or at least one material having ferroelectric characteristics which is selected from a perovskite type ferroelectric material, a ferroelectric polymer PVDF material and a $HfO_2$ based ferroelectric material; and
   wherein the upper electrode layer is made of at least one of W, Al, Cu, Ru, Ti, Ta, TiN, TaN, $IrO_2$, ITO, and IZO.

10. The complementary storage unit according to claim 9, wherein the $HfO_2$ based ferroelectric material is a $HfO_2$ based material doped with at least one element of Zr, Al, Si, and La.

11. A complementary memory, having an array structure formed of a plurality of complementary storage units according to claim 1.

12. A method of preparing the complementary storage unit according to claim 1, comprising:
   forming a control transistor, wherein the control transistor is configured to control reading and writing of the storage unit; and
   symmetrically forming a pull-up diode and a pull-down diode on the control transistor in a first direction.

* * * * *